(12) United States Patent
Leong

(10) Patent No.: US 11,456,735 B1
(45) Date of Patent: Sep. 27, 2022

(54) NORMALLY-OFF POWER SWITCH WITH INTEGRATED FAILSAFE PULLDOWN CIRCUIT AND CONTROLLABLE TURN-OFF TIME

(71) Applicant: Infineon Technologies Austria AG, Villach (AT)

(72) Inventor: Kennith Kin Leong, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 17/333,487

(22) Filed: May 28, 2021

(51) Int. Cl.
*H03K 17/06* (2006.01)
*H03K 17/687* (2006.01)
*H03K 17/0814* (2006.01)

(52) U.S. Cl.
CPC ..... *H03K 17/063* (2013.01); *H03K 17/08142* (2013.01); *H03K 17/6871* (2013.01); *H03K 2017/066* (2013.01)

(58) Field of Classification Search
CPC ........... H03K 17/063; H03K 17/08142; H03K 17/6871; H03K 2017/066
See application file for complete search history.

(56) References Cited

U.S. PATENT DOCUMENTS

| 10,438,945 B2 * | 10/2019 | Vielemeyer | H01L 27/088 |
| 10,720,913 B1 | 7/2020 | Leong et al. | |
| 2014/0167724 A1 * | 6/2014 | Deng | H03K 17/302 327/109 |

* cited by examiner

*Primary Examiner* — Metasebia T Retebo
(74) *Attorney, Agent, or Firm* — Murphy, Bilak & Homiller, PLLC

(57) ABSTRACT

A semiconductor device includes a normally-off power transistor integrated in a semiconductor die and a first failsafe pulldown circuit. A gate of the normally-off power transistor is electrically connected to a control terminal of the semiconductor die. The first failsafe pulldown circuit includes a first normally-on pulldown transistor integrated in the semiconductor die and a turn-off time control circuit. A gate of the first normally-on pulldown transistor is electrically connected to a first reference terminal of the semiconductor die. The first normally-on pulldown transistor is configured to pull down the gate of the normally-off power transistor to a voltage below a threshold voltage of the normally-off power transistor when no voltage is applied across the control terminal and the first reference terminal. The turn-off time control circuit is configured to control a turn-off time of the normally-off power transistor.

30 Claims, 8 Drawing Sheets

NORMALLY-OFF POWER SWITCH WITH INTEGRATED FAILSAFE PULLDOWN CIRCUIT AND CONTROLLABLE TURN-OFF TIME

BACKGROUND

Gallium Nitride (GaN) based switches, and other similar High Electron Mobility Transistors (HEMTs) based on heterojunctions, provide high voltage support, low drain-to-source on resistance, low gate-drive charge requirements, and fast switching. As a result of these characteristics, GaN-based switches are increasingly being used in applications that require high efficiency and high-frequency support, including, notably, switching power converters. However, some GaN-based switches have unique gate-drive requirements, as compared with conventional metal-oxide semiconductor field-effect transistors (MOSFETs) and bipolar junction transistors (BJTs), and typically require complex gate-drive circuitry.

A GaN-based switch in its native state is a normally-on (depletion-mode) device. Such a device conducts current from its drain to its source when no voltage is applied to its gate, relative to its source, and requires application of a negative voltage to its gate to force the device into a non-conducting (blocking) state. Such normally-on behavior is unsuitable for most applications. Hence, modifications to GaN-based switches have been developed so as to convert them into normally-off (enhancement-mode) devices. For example, a p-doped GaN layer introduced between the gate metal and the heterostructure of a GaN-based switch has the effect of raising the switch's turn-on/off or voltage threshold to a positive value, thereby providing a normally-off device. Enhancement-mode switches based on such a gate structure are known as Gate Injection Transistors (GITs).

GaN-based GITs have a relatively low threshold voltage for switching between their conducting (on) and blocking (off) states. This threshold voltage is typically in the range of 1.2 to 3.5V, which is significantly lower than corresponding thresholds, e.g., 5V, for other power MOSFETs. Additionally, HEMTs, including GaN-based GITs, have low gate-to-source and gate-to-drain capacitances, which are notably smaller than corresponding capacitances in other power MOSFETs. While the low threshold voltage and low gate capacitance of a GaN-based GIT advantageously provide fast switching speeds and low gate charge requirements, these characteristics also make a GaN-based GIT susceptible to being undesirably turned on due to voltage perturbations at the gate of the GIT during intervals when the GIT is intended to be held in its non-conducting (blocking) state. For example, noise at the gate could cause its voltage to rise above the GIT's threshold voltage, though the gate is intended to be held at a low voltage. Such noise may occur during operational intervals when the GIT is intended to be held in its non-conducting state, and during start-up intervals during which the gate may not yet be provided with a driven control signal. Additionally, the gate voltage may be susceptible to ringing after the control voltage is transitioned from a high (turn-on) voltage level to a low (turn-off) voltage level. The voltage level of the ringing can exceed the GIT's threshold voltage, thereby unintentionally turning on the GIT.

The above problems are conventionally addressed using complex circuitry customized for driving GaN-based GITs or similar enhancement-mode HEMTs. Such circuitry typically drives a negative voltage onto the gate to turn off the GIT, thereby providing significant margin between the driven gate voltage and the turn-on threshold voltage of the GIT. This margin allows the GaN-based GIT to be reliably held in its non-conducting (blocking) state. A resistor-resistor-capacitor (RRC) circuit is often included in the driving circuitry, so as to provide high current when the GaN-based GIT is initially transitioned to a conducting state. Lower current is provided subsequently to maintain the conducting state of the GIT. The RRC circuit additionally has the effect of applying a relatively high magnitude of the negative voltage when the GaN-based GIT is transitioned off, and this negative voltage dissipates towards zero as the off interval proceeds. Typical driving circuitry, as described above, includes at least two and as many as four driver switches, each of which must be controlled, and provides three or four voltage levels to the gate.

The typical GIT driver circuitry described above has many problems. First, the negative voltage provided at the gate during the turn-off interval leads to a large required voltage swing when the GIT is transitioned to its conducting state, thereby slowing the transition and the potential switching speed of the GIT. Second, the RRC-based dissipation means that the level of the negative voltage will vary according to the switching duty cycle, thereby leading to transition times that are inconsistent, which complicates the use and control of the GIT. Third, while the negative voltage described above reliably holds the GIT off during steady-state operation, spurious non-zero voltage during an initial start-up interval, before the negative voltage is driven to the gate, may undesirably turn on the GIT. Fourth, the negative voltage adds an offset to the effective reverse body diode voltage, thereby increasing the threshold voltage of the effective reverse body diode and increasing associated losses. Lastly, the driver circuitry is quite complex, and requires fairly complex control of switches within the driver circuit itself.

SUMMARY

According to an embodiment of a semiconductor device, the semiconductor device comprises: a normally-off power transistor integrated in a semiconductor die, wherein a gate of the normally-off power transistor is electrically connected to a control terminal of the semiconductor die; and a first failsafe pulldown circuit comprising: a first normally-on pulldown transistor integrated in the semiconductor die, wherein a gate of the first normally-on pulldown transistor is electrically connected to a first reference terminal of the semiconductor die, wherein the first normally-on pulldown transistor is configured to pull down the gate of the normally-off power transistor to a voltage below a threshold voltage of the normally-off power transistor when no voltage is applied across the control terminal and the first reference terminal; and a turn-off time control circuit configured to control a turn-off time of the normally-off power transistor.

According to an embodiment of a semiconductor die, the semiconductor die comprises: a control terminal; a first reference terminal; a normally-off power transistor having a gate electrically connected to the control terminal; and a first failsafe pulldown circuit comprising: a first normally-on pulldown transistor having a gate electrically connected to the first reference terminal, wherein the first normally-on pulldown transistor is configured to pull down the gate of the normally-off power transistor to a voltage below a threshold voltage of the normally-off power transistor when no voltage is applied across the control terminal and the first reference terminal; and a first resistor electrically connected in series between the first normally-on pulldown transistor and the gate of the normally-off power transistor.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments may be combined unless they exclude each other. Embodiments are depicted in the drawings and are detailed in the description that follows.

DETAILED DESCRIPTION

Figure 1:
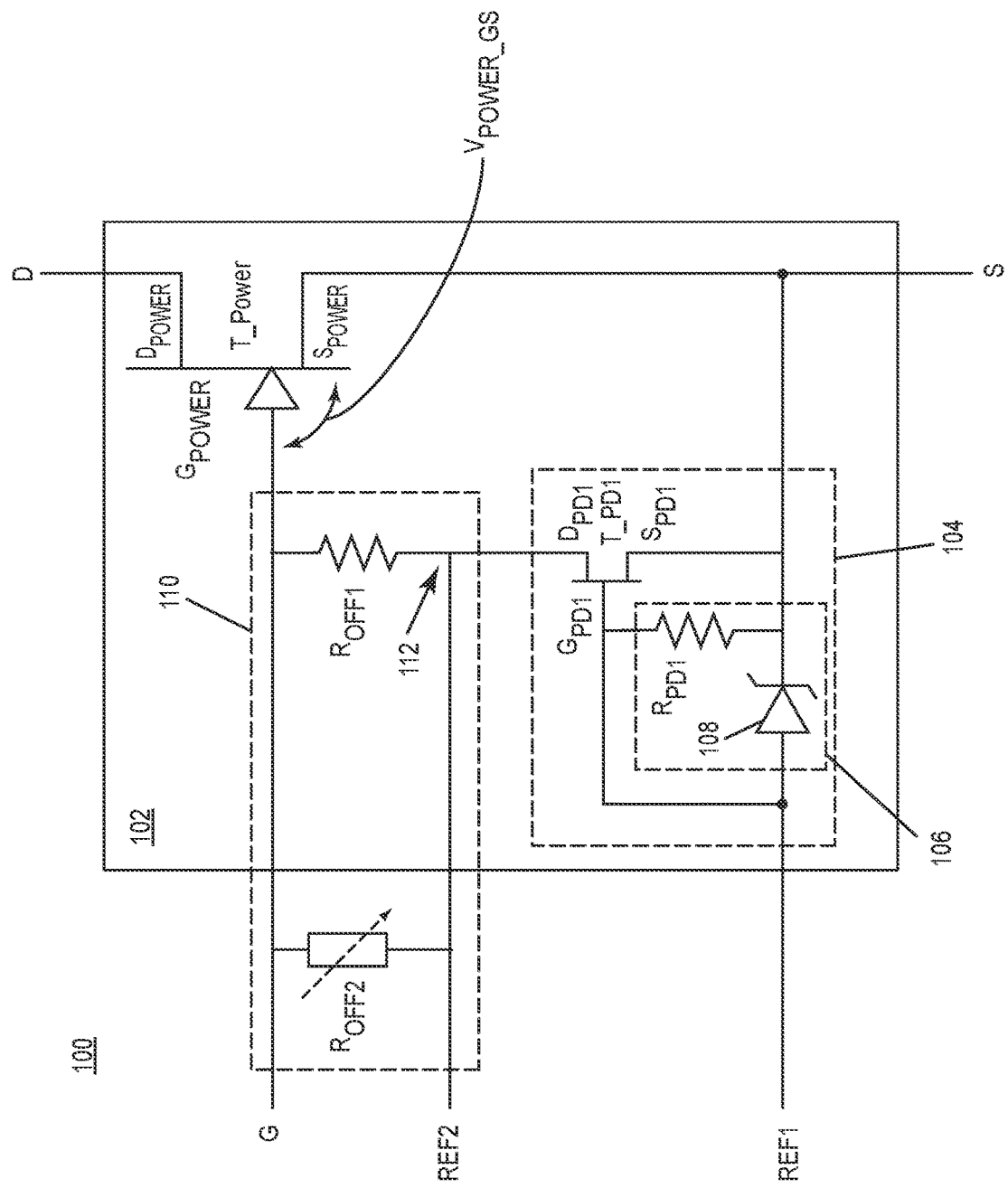
FIG. 1 illustrates an embodiment of a semiconductor device that includes a normally-off power transistor integrated in a semiconductor die with a first failsafe pulldown circuit for controlling turn-off time.

The embodiments described herein provide circuits and devices that include a failsafe pulldown circuit with controllable turn-off time for the gate of a power switch. While the described examples are explained in the context of a Gallium Nitride (GaN) based Gate Injection Transistor (GIT) as the power switch, the techniques are applicable to other transistor or semiconductor types including, notably, other enhancement-mode High Electron Mobility Transistors (HEMTs) characterized in having low turn on/off threshold voltages and low gate capacitances. The failsafe pulldown circuit prevents the power switch from being unintentionally turned on due to spurious noise or ringing, does not require use of a negative voltage at the gate of the power switch, and provides controllable turn-off time for the power switch. An additional failsafe pulldown circuit may be provided to ensure the power switch remains off when in a powered down state during which no switching of the power switch occurs. Many of the problems associated with applying a negative voltage to the power switch gate are, thus, avoided.

The embodiments are described primarily in the context of a power switch device in which a failsafe pulldown circuit and a power switch (e.g., a GIT) are integrated in the same GaN semiconductor die. However, the die could similarly be comprised of some other group III/V semiconductor or a silicon-based semiconductor. The described integration of the failsafe pulldown circuit and the power switch presents significant advantages in reliably maintaining a desired turn-off (non-conducting) state of the power switch with controllable turn-off time. In particular, such integration minimizes parasitic inductances between the gate of the power switch and the failsafe pulldown circuit, thereby constraining voltage ringing that potentially occurs when the control voltage driven to the gate transitions between high and low voltage levels. The reduced ringing effectively clamps the gate-to-source voltage of the power switch close to zero during turn-off intervals, which prevents unintended turning on of the power switch. Integration of the failsafe pulldown circuit in close proximity to the power switch also reduces interconnect paths (e.g., traces, terminals), thereby minimizing the potential for noise to couple onto the gate. This also prevents unintentional turning on of the power switch, particularly when no drive signal is applied to the gate as occurs during start-up intervals. The controllable turn-off time provides a controlled turn off speed for the power switch, e.g., for high power applications which may be subject to stringent EMI (electromagnetic interference) requirements and/or for added end-user configurability. The additional failsafe pulldown circuit ensures the power switch remains off in the powered down state, in case the clamping capability of the primary failsafe pulldown circuit is limited under no power/start-up conditions.

While the embodiments are described primarily in the context of an integrated power switch device including both a failsafe pulldown circuit and a normally-off power transistor as a power switch, the failsafe pulldown circuit and the normally-off power transistor may be provided on separate dies, i.e., may not be monolithically integrated. Such a solution provides improvement over prior circuitry for controlling a GIT, but may not achieve the significant advantage of reduced noise (improved reliability) that is provided by an integrated power device.

The failsafe pulldown circuit and normally-off power transistor may be provided on separate dies that are integrated within the same package, i.e., within a system-in-package or multi-chip module. Such a system-in-package achieves reduced parasitics and improved reliability as compared with a solution spread across separate packages, but may not achieve the same level of performance as a solution wherein the failsafe pulldown circuit and normally-off power transistor are integrated on the same die.

The normally-off power transistor may be controlled by a driver that is considerably simpler than typical drivers used for controlling GITs, and that notably avoids complex switching sequences (state machines) within the driver and circuitry for generating a negative voltage. Furthermore, the normally-off power transistor may be controlled using only two voltage levels, rather than the three or four voltage levels typically required for driving a GIT. The failsafe pulldown circuit requires no separate control signalling, and is effectively controlled using the same two-level voltage signal that drives the gate of the normally-off power transistor (e.g., GIT). Hence, the drivers used to control the normally-off power transistors (e.g., GITs) described herein may be similar to other gate drivers, including those used in driving conventional MOSFETs.

FIG. 1 illustrates an embodiment of a semiconductor device 100 that includes a normally-off power transistor 'T_Power' integrated in a semiconductor die 102. The normally-off power transistor T_Power functions as a power switch, e.g., as part of a switching power converter or other type of electric power conversion or inversion system. In one embodiment, the semiconductor die 102 is a GaN die and the normally-off power transistor T_Power is a GaN-based HEMT such as a GIT, which is a type of enhancement-mode HEMT. However, the semiconductor die 102 may comprise another group Ill/V semiconductor or a silicon-based semiconductor and/or the normally-off power transistor T_Power may be another type of normally-off power MOSFET.

The normally-off power transistor T_Power has a drain '$D_{POWER}$' electrically connected to a first load terminal 'D' of the semiconductor die 102, a source '$S_{POWER}$' electrically connected to a second load terminal 'S' of the semiconductor die 102, and a gate '$G_{POWER}$' electrically connected to a control terminal 'G' of the semiconductor die 102. Each terminal D, S, G, 'REF2', 'REF1' of the semiconductor die 102 may be implemented as one or more bond pads, pins, Cu pillars, etc. In each case, the terminals D, S, G, REF2, REF1 provide external electrical access to the internal circuitry included in the semiconductor die 102.

The normally-off power transistor T_Power is a normally-off device but may have a relatively low threshold voltage for turning on or off, e.g., in the range of 1.2 to 3.5V for a GaN-based GIT. This, in addition to possibly low gate capacitances of the normally-off power transistor T_Power, may make the normally-off power transistor T_Power susceptible to unintentional transitions to a conducting state.

To prevent such unintentional transitions, the semiconductor device 100 further includes a first failsafe pulldown circuit 104. As configured in FIG. 1, the first failsafe pulldown circuit 104 shorts the gate $G_{POWER}$ and source $S_{POWER}$ of the normally-off power transistor T_Power together, such that there is no positive control voltage $V_{Power\_GS}$ to turn on the normally-off power transistor T_Power, during periods when the voltage provided across the control terminal G and first reference terminal REF1 of the semiconductor die 102 is below a turn-on voltage for the normally-off power transistor T_Power, or when this voltage is not driven, e.g., is floating. The first reference terminal REF1 may be an effective Kelvin-source terminal or another type of dedicated small signal terminal electrically connected to the source $S_{POWER}$ of the normally-off power transistor T_Power through the first failsafe pulldown circuit 104. The first reference terminal REF1 provides a reference terminal for an external driver circuit that drives the gate $G_{POWER}$ of the normally-off power transistor T_Power.

The first failsafe pulldown circuit 104 includes a first normally-on pulldown transistor T_PD1 integrated in the same semiconductor die 102 as the normally-off power transistor T_Power. For the illustrated example wherein the normally-off power transistor T_Power is a GaN-based GIT (enhancement-mode HEMT), the first normally-on pulldown transistor T_PD1 of the first failsafe pulldown circuit 104 may be a depletion-mode GaN-based HEMT. Such a pulldown device turns off (set to a blocking mode) when its gate-to-source voltage $V_{PD\_GS}$ is sufficiently negative, e.g., below a turn-off threshold voltage $V_{PD\_THR}$ that is typically in the range of −4V to −7V. Otherwise, including when zero pulldown gate-to-source voltage $V_{PD\_GS}$ is applied and when no voltage is actively driven across the gate '$G_{PD1}$' and source '$S_{PD1}$' of the first normally-on pulldown transistor T_PD1, the first normally-on pulldown transistor T_PD1 conducts. Locating the first normally-on pulldown transistor T_PD1 in the same semiconductor die 102 as the normally-off power transistor T_Power and in close proximity to the gate $G_{POWER}$ and source $S_{POWER}$ of the normally-off power transistor T_Power makes it unlikely for the normally-off power transistor T_Power to unintentionally be transitioned to its on state.

The gate $G_{PD1}$ of the first normally-on pulldown transistor T_PD1 of the first failsafe pulldown circuit 104 is electrically connected to the first reference terminal REF1 of the semiconductor die 102. The first normally-on pulldown transistor T_PD1 pulls down the gate $G_{POWER}$ of the normally-off power transistor T_Power to a voltage below the threshold voltage of the normally-off power transistor T_Power when no voltage is applied across the control terminal G and the first reference terminal REF1 of the semiconductor die 102.

The first failsafe pulldown circuit 104 may also include a pulldown control circuit 106 connected between the gate $G_{PD1}$ and source $S_{PD1}$ of the first normally-on pulldown transistor T_PD1. The pulldown control circuit 106 provides a voltage between the gate $G_{PD1}$ and source $S_{PD1}$ of first normally-on pulldown transistor T_PD1. For example, the pulldown control circuit 106 may apply a negative voltage to the gate $G_{PD1}$ of the first normally-on pulldown transistor T_PD1, relative to the source $S_{PD1}$ of the first normally-on pulldown transistor T_PD1, when a turn-on voltage is applied between the control terminal G and first reference terminal REF1 of the semiconductor die 102, and does so autonomously, i.e., no separate external signals are required to control the pulldown control circuit 106. The pulldown control circuit 106 also autonomously discharges the negative voltage when the turn-on voltage is not applied between the control terminal G and first reference terminal REF1 of the semiconductor die 102.

In one embodiment, the pulldown control circuit 106 includes a voltage clamp 108 and a pulldown resistor $R_{PD1}$. The voltage clamp 108 generates a pulldown gate-to-source voltage $V_{PD\_GS}$ that is below the negative threshold voltage $V_{PD\_THR}$ required to turn off the first normally-on pulldown transistor T_PD1, during intervals when the normally-off power transistor T_Power is on (conducting). The voltage clamp 108 may be, or be modelled as, a diode having a threshold voltage. For example, the voltage clamp 108 may be, or be modelled as, a Zener diode as indicated in FIG. 1. The magnitude of the forward threshold voltage for a typical diode is lower than the magnitude of the turn-off threshold voltage $V_{PD\_THR}$ of the first normally-on pulldown transistor T_PD1. Hence, the voltage clamp 108 may include several diodes cascaded (stacked) in series, so as to achieve a clamping voltage VCL that is required to turn-off the first normally-on pulldown transistor T_PD1, i.e., VCL>|$V_{PD\_THR}$|.

The pulldown resistor $R_{PD1}$ of the pulldown control circuit 106 ensures that the first normally-on pulldown transistor T_PD1 is turned back on under no power/signal conditions. For example, if no voltage is being driven across the control terminal G and first reference terminal REF1 of the semiconductor die 102, the pulldown resistor $R_{PD1}$ ensures that the gate $G_{PD1}$ and source $S_{PD1}$ of the first normally-on pulldown transistor T_PD1 are pulled to the same voltage, e.g., $V_{PD\_GS}$=0, thereby turning on the first normally-on pulldown transistor T_PD1, so as to short the power transistor gate $G_{POWER}$ to the power transistor source $S_{POWER}$. If the power and pulldown transistors T_Power, T_PD1 are integrated in the same semiconductor die 102, the pulldown resistor $R_{PD1}$ may also be integrated in the same semiconductor 102. For the example of a GaN semiconductor die 102, the pulldown resistor $R_{PD1}$ also may be made of GaN. In particular, the pulldown resistor $R_{PD1}$ of the first failsafe pulldown circuit 104 may include one or more two-dimensional electron gas (2DEG) regions of the GaN semiconductor die 102, which is substantially a GaN HEMT without the gate.

The semiconductor device 100 also includes a turn-off time control circuit 110 for controlling the turn-off time of the normally-off power transistor T_Power. In some applications, such as high power applications subject to stringent EMI requirements, controlled turn off speed for the normally-off power transistor T_Power may be desirable. Controlled turn off speed for the normally-off power transistor T_Power also provides further end-user configurability.

The turn-off time control circuit 110 provides a controlled turn-off time for the normally-off power transistor T_Power. The controlled turn-off time may be fixed (i.e., programmed once) or programmable (i.e., capable of being reprogrammed).

In one embodiment, the turn-off time control circuit 110 includes a first resistor $R_{OFF1}$ integrated in the same semiconductor die 102 as the normally-off power transistor T_Power and the first normally-on pulldown transistor T_PD1. The first resistor $R_{OFF1}$ of the turn-off time control circuit 110 is electrically connected in series between the drain '$D_{PD1}$' of the first normally-on pulldown transistor T_PD1 and the gate $G_{POWER}$ of the normally-off power transistor T_Power. For the example of a GaN semiconductor die 102, the first resistor $R_{OFF1}$ of the turn-off time control circuit 110 may also made of GaN. In particular, the first resistor $R_{OFF1}$ may include one or more two-dimensional electron gas (2DEG) regions of the GaN semiconductor die 102, which is substantially a GaN HEMT without the gate. More generally, the resistance value of the first resistor $R_{OFF1}$ determines, at least partly, the turn-off time of the normally-off power transistor T_Power.

For example, the turn-off time control circuit 110 may also include a second resistor $R_{OFF2}$ which is external to the semiconductor die 102 and electrically connected in parallel with the first resistor $R_{OFF1}$. In this example, $R_{OFF1} \| R_{OFF2}$ determines the turn-off time for the normally-off power transistor T_Power. $R_{OFF1}$ may have a higher resistance than $R_{OFF2}$. In this case, $R_{OFF2}$ may be used to turn off the normally-off power transistor T_Power faster, which may be more beneficial for low power applications. $R_{OFF2}$ may have a fixed resistance that is determined once. Alternatively, $R_{OFF2}$ may have a programmable resistance, as indicated by the dashed slanted line in FIG. 1, and that may be adjusted accordingly, e.g., based on testing or monitoring of the semiconductor device 100. For example, $R_{OFF2}$ may be a programmable resistor included in a controller (not shown) that is configured to control turn-off of the normally-off power transistor T_Power during normal (field) operation. The controller may adjust the value of $R_{OFF2}$ based on operating conditions of the semiconductor device 100.

The semiconductor die 102 may also include a second reference terminal REF2 electrically connected to a node 112 between the first resistor $R_{OFF1}$ of the turn-off time control circuit 110 and the drain $D_{PD1}$ of the first normally-on pulldown transistor T_PD1. The second reference terminal REF2 of the semiconductor die 102 provides a point of external electrical connection for the second resistor $R_{OFF2}$ of the turn-off time control circuit 110, if $R_{OFF2}$ is used. The first resistor $R_{OFF1}$ and the second resistor $R_{OFF2}$ of the turn-off time control circuit 110 are electrically connected in parallel between the control terminal G and second reference terminal REF2 of the semiconductor die 102. If the second resistor $R_{OFF2}$ is not used, the second reference terminal REF2 may be omitted. In this case, just the first resistor $R_{OFF1}$ controls the turn-off of the normally-off power transistor T_Power.

The resistance of the first resistor $R_{OFF1}$ of the turn-off time control circuit 110 may be set relatively high, e.g., between 100 to 500 to enable slow switching of the normally-off power transistor T_Power, even if the second resistor $R_{OFF2}$ of the turn-off time control circuit 110 is omitted, and while still setting the slowest possible switching speed for the normally-off power transistor T_Power. The turn off speed of the normally-off power transistor T_Power may be increased by including $R_{OFF2}$ in parallel with $R_{OFF1}$. The value of $R_{OFF2}$ may be smaller than $R_{OFF1}$, and $R_{OFF2}$ may be placed as close as possible to the control terminal G and second reference terminal REF2 of the semiconductor die 102, to minimize parasitic inductance within this loop. If $R_{OFF2}$ is included in the turn-off time control circuit 110, $R_{OFF2}$ and $R_{OFF1}$ operate in parallel and the total turn off resistance seen by the normally-off power transistor T_Power becomes:

$$R_{turn\text{-}off} = \left( \frac{1}{1/R_{off1}} + \frac{1}{1/R_{off2}} \right) + R_{para} \quad (1)$$

where with $R_{para}$ is the intrinsic parasitic resistance of the monolithic turn off path. $R_{para}$ should be much smaller than $R_{OFF1}$ and $R_{OFF2}$ so that with the absence of $R_{OFF2}$, $R_{OFF1}$ should dominate the gate impedance of the normally-off power transistor T_Power. By connecting $R_{OFF2}$, the turn-off resistance $R_{turn\text{-}off}$ seen by the normally-off power transistor T_Power is reduced. Accordingly, the turn-off speed of the normally-off power transistor T_Power may be controlled by adjusting the impedance seen by the gate $G_{POWER}$ of the normally-off power transistor T_Power.

Figure 2:
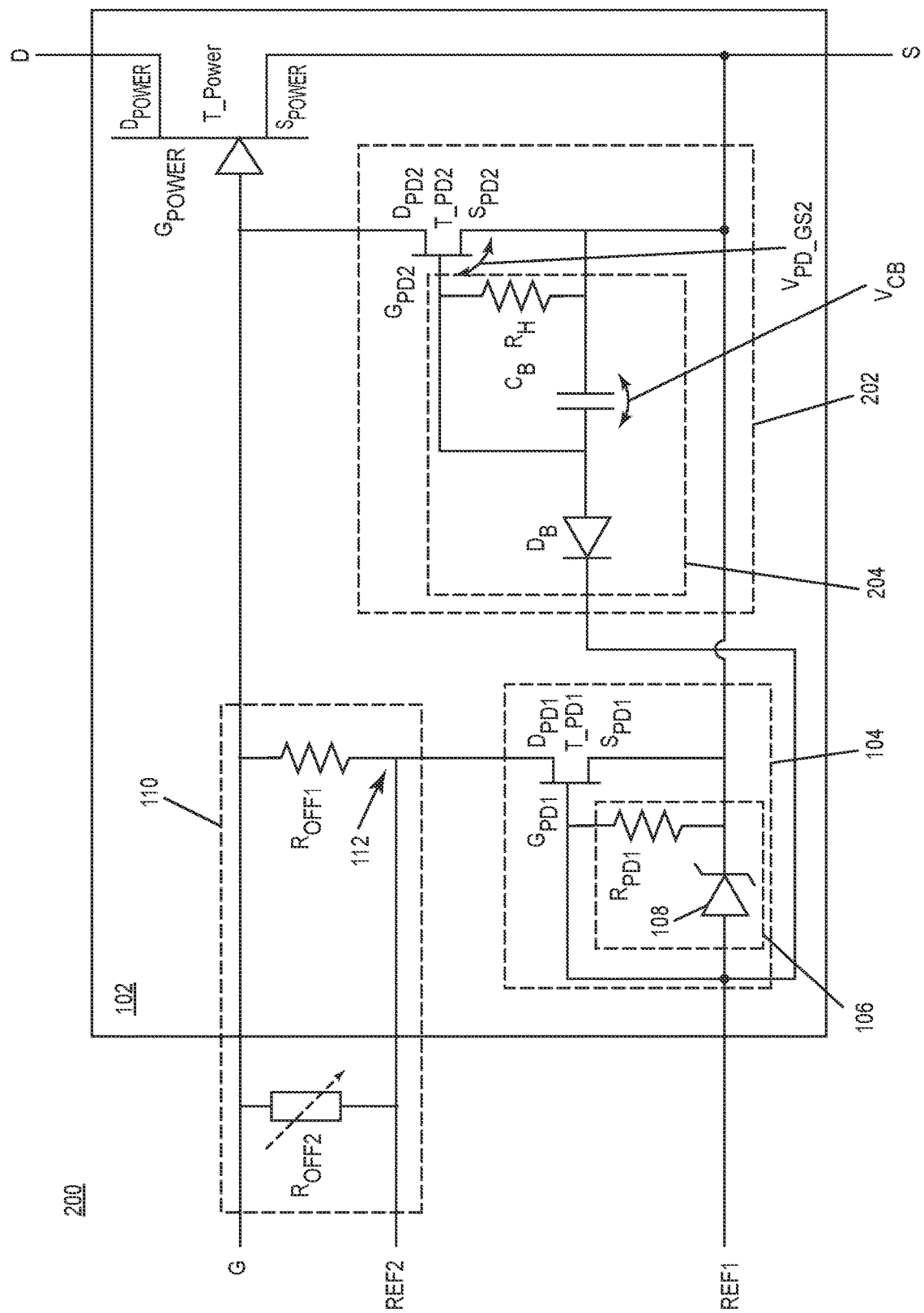
FIG. 2 illustrates an embodiment of a semiconductor device that includes a normally-off power transistor integrated in a semiconductor die with the failsafe pulldown circuit and a second failsafe pulldown circuit for enhanced turn-off time control.

FIG. 2 illustrates another embodiment of a semiconductor device 200 that includes the normally-off power transistor T_Power, the first failsafe pulldown circuit 104, and the turn-off time control circuit 110. The embodiment shown in FIG. 2 is similar to the embodiment shown in FIG. 1. Different, however, the semiconductor device 200 shown in FIG. 2 further includes a second failsafe pulldown circuit 202 integrated in the same semiconductor die 102 as the normally-off power transistor T_Power and the first failsafe pulldown circuit 104.

The second failsafe pulldown circuit 202 pulls down the gate $G_{POWER}$ of the normally-off power transistor T_Power to a voltage below the threshold voltage of the normally-off power transistor T_Power when the normally-off power transistor T_Power is in a powered down state during which no switching of the normally-off power transistor T_Power occurs. The powered down state may correspond to a low or no power state in which the normally-off power transistor T_Power is not switched over an extended period of time. For example, the powered down state may be a no power state in which no power is provided to the semiconductor die 102, or a start-up state in which the normally-off power transistor T_Power gradually transitions from a no power state to a normal power state.

The first resistor $R_{OFF1}$ of the turn-off time control circuit 110 may have a relatively high resistance as explained above, e.g., between 10Ω to 50Ω. The clamping capability of the first normally-on pulldown transistor T_PD1 of the first failsafe pulldown circuit 104 may be limited if $R_{OFF1}$ is relatively high. In this case, the pulldown effect provided by the first normally-on pulldown transistor T_PD1 may be weakened in the powered down state, which could lead to inadvertent turn on of the normally-off power transistor T_Power.

The second failsafe pulldown circuit 202 compensates for any pulldown weakness caused by the first resistor $R_{OFF1}$ of the turn-off time control circuit 110. More particularly, the second failsafe pulldown circuit 202 includes a second normally-on pulldown transistor T_PD2. Similar to the first normally-on pulldown transistor T_PD1, the second normally-on pulldown transistor T_PD2 is electrically connected between the gate $G_{POWER}$ and source $S_{POWER}$ of the normally-off power transistor T_Power, and the gate $G_{PD2}$ of the second normally-on pulldown transistor T_PD2 is electrically connected to the first reference terminal REF1 of the semiconductor die 102, e.g., through a diode $D_B$. However, unlike the first normally-on pulldown transistor T_PD1, no additional resistor is inserted in the path between the drain $D_{PD2}$ of the second normally-on pulldown transistor T_PD2 and the gate $G_{POWER}$ of the normally-off power transistor T_Power, making the second normally-on pulldown transistor T_PD2 stronger that the first normally-on pulldown transistor T_PD1. The pulldown provided by the first normally-on pulldown transistor T_PD1 is compensated or enhanced by the second normally-on pulldown transistor T_PD2, thereby avoiding inadvertent turn on of the normally-off power transistor T_Power while in the powered down state.

Since weakened pulldown may be a concern mainly in the powered down state during which no switching of the normally-off power transistor T_Power occurs, the second failsafe pulldown circuit 202 may also include a pulldown control circuit 204 for controlling when the second normally-on pulldown transistor T_PD2 is conducting and not conducting. The second normally-on pulldown transistor T_PD2 does not compensate pulldown of the power transistor gate $G_{POWER}$ when the second normally-on pulldown transistor T_PD2 is not conducting.

The pulldown control circuit 204 is connected between the gate $G_{PD2}$ of the second normally-on pulldown transistor T_PD2 and the source $S_{PD2}$ of the second normally-on pulldown transistor T_PD2. The pulldown control circuit 204 holds the gate $G_{PD2}$ of the second normally-on pulldown transistor T_PD2 above a turn-off voltage of the second normally-on pulldown transistor T_PD2 when the normally-off power transistor T_Power is in the powered down state.

For the illustrated example wherein the normally-off power transistor T_Power is a GaN-based GIT (enhancement-mode HEMT), the second normally-on pulldown transistor T_PD2 of the second failsafe pulldown circuit 202 may be a depletion-mode GaN-based HEMT. Such a pulldown device turns off (set to a blocking mode) when its gate-to-source voltage $V_{PD\_GS}$ is sufficiently negative, e.g., below a turn-off threshold voltage $V_{PD\_THR}$ that is typically in the range of −4V to −7V. Otherwise, including when zero pulldown gate-to-source voltage $V_{PD\_GS2}$ is applied and when no voltage is actively driven across the gate '$G_{PD2}$' and source '$S_{PD2}$' of the second normally-on pulldown transistor T_PD2, the second normally-on pulldown transistor T_PD2 conducts. Holding $G_{PD2}$ above the turn-off voltage of the second normally-on pulldown transistor T_PD2 in this case means that the pulldown control circuit 204 of the second failsafe pulldown circuit 202 keeps $G_{PD2}$ above the negative threshold voltage to hold the gate on, ensuring that the normally-off power transistor T_Power remains off.

The pulldown control circuit 204 of the second failsafe pulldown circuit 202 lowers the voltage at the gate $G_{PD2}$ of the second normally-on pulldown transistor T_PD2 to below the turn-off voltage of the second normally-on pulldown transistor T_PD2 when the normally-off power transistor T_Power is in a normal switching state during which the normally-off power transistor T_Power is successively switched on and off responsive to a switching control signal input to the control terminal G of the semiconductor die 102. In one embodiment, the pulldown control circuit 204 of the second failsafe pulldown circuit 202 includes a capacitor $C_B$ electrically connected between the gate $G_{PD2}$ of the second normally-on pulldown transistor T_PD2 and the source $S_{PD2}$ of the second normally-on pulldown transistor T_PD2. The pulldown control circuit 204 of the second failsafe pulldown circuit 202 further includes a resistor $R_H$ electrically connected between the gate $G_{PD2}$ of the second normally-on pulldown transistor T_PD2 and the source $S_{PD2}$ of the second normally-on pulldown transistor T_PD2.

The RC time constant of the capacitor and resistor pairing $C_B$, $R_H$ determines when the second normally-on pulldown transistor T_PD2 turns on again after having previously turned off. The capacitor $C_B$ is recharged each time the normally-off power transistor T_Power is switched on. The voltage $V_{CB}$ of the capacitor $C_B$ continuously holds the gate $G_{PD2}$ of the second normally-on pulldown transistor T_PD2 below the turn-off voltage of the second normally-on pulldown transistor T_PD2 when the normally-off power transistor T_Power is in the normal switching state, ensuring the second normally-on pulldown transistor T_PD2 remains off when the normally-off power transistor T_Power is in the normal switching state. In one embodiment, the RC time constant of the capacitor and resistor pairing $C_B$, $R_H$ is selected such that the capacitor voltage $V_{CB}$ rises above the turn-off voltage of the second normally-on pulldown transistor T_PD2 when the normally-off power transistor T_Power remains switched off for 1 ms or more.

As explained above, the first turn on or startup from a no power condition conventionally has been a problem in that the main power switch must be clamped. With the techniques presented herein, the capacitor $C_B$ begins charging once power is applied between the control terminal and the first reference terminal REF1 of the semiconductor die 102. Once the voltage $V_{CB}$ of the capacitor $C_B$ reaches the turn-off voltage of the second normally-on pulldown transistor T_PD2, the second normally-on pulldown transistor T_PD2 turns off and no longer contributes to the pulldown.

The RC time constant of the capacitor and resistor pairing $C_B$, $R_H$ may be programmed such that it takes a long time to turn the second normally-on pulldown transistor T_PD2 back on, since the additional pulldown functionality provided by the second normally-on pulldown transistor T_PD2 is needed most during a no power condition. Accordingly, the RC time constant of the capacitor and resistor pairing $C_B$, $R_H$ may be programmed such that the second normally-on pulldown transistor T_PD2 turns back on when a no power condition persists for a long period of time, e.g., 1 ms or more. The first failsafe pulldown circuit 104 continues to operate during normal on/off switching of the normally-off power transistor T_Power. Every time the normally-off power transistor T_Power is turned on, the capacitor $C_B$ is 'topped off' to a fully charge state and the second normally-on pulldown transistor T_PD2 remains off. In one embodiment, the capacitor $C_B$ is implemented as a metal-insulator-metal capacitor and the resistor $R_H$ is a standard GaN resistor.

Figure 3:
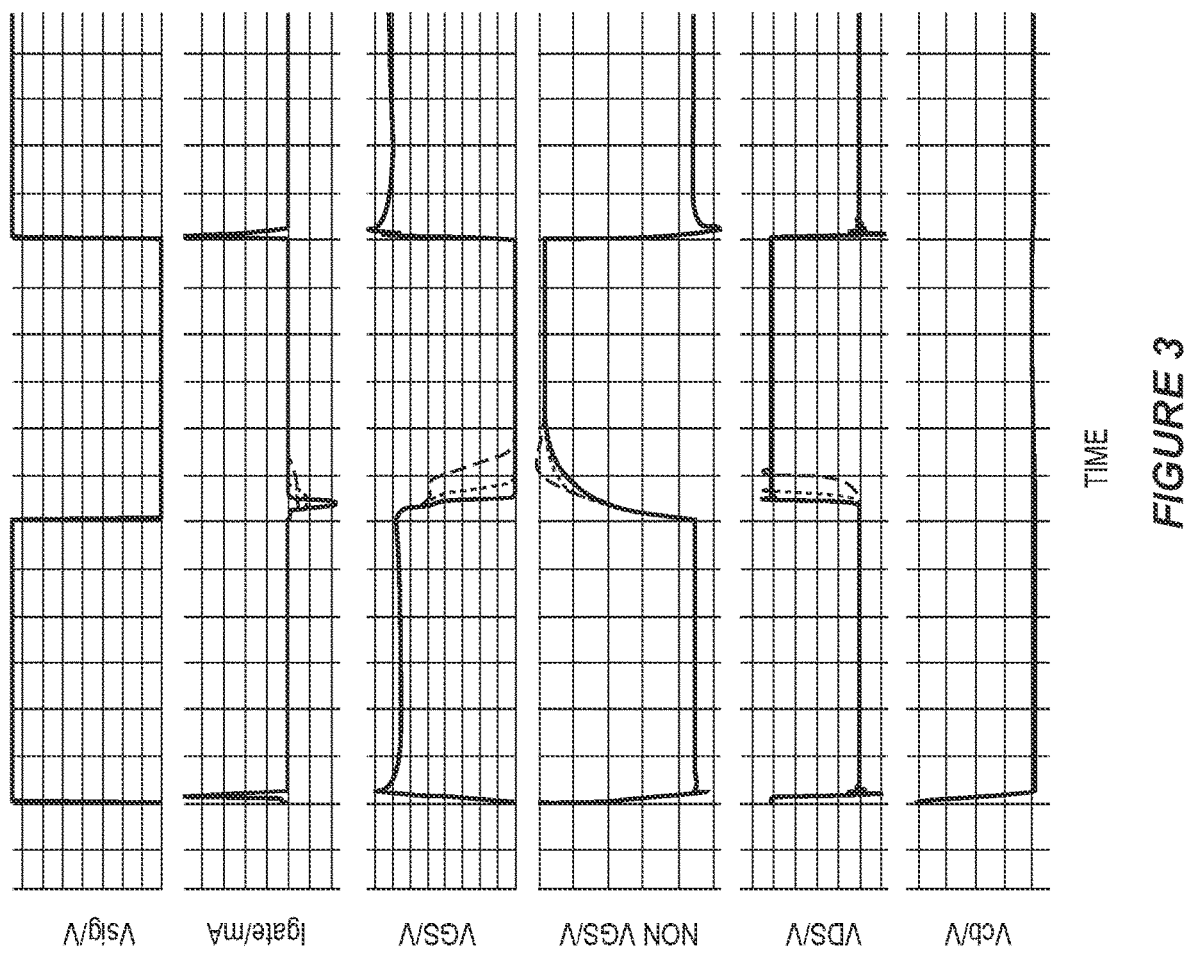
FIG. 3 illustrates an example of waveforms corresponding to the semiconductor device of FIG. 2.

FIG. 3 illustrates various waveforms resulting from a simulation, including the gate-to-source voltage 'NON VGS' of the second normally-on pulldown transistor T_PD1, the gate-to-source voltage 'VGS' of the normally-off power transistor T_Power, the drain-to-source voltage 'VDS' of the normally-off power transistor T_Power, and the gate current 'Igate' of the normally-off power transistor T_Power. The capacitor $C_B$ ensures that the second normally-on pulldown transistor T_PD2 turns off as soon as a turn ON signal 'Vsig' is applied to the control terminal G of the semiconductor die 102, and that the second normally-on pulldown transistor T_PD2 remains off as long as the voltage $V_{CB}$ across the capacitor $C_B$ does not discharge below the turn-off threshold voltage of the second normally-on pulldown transistor T_PD2. As long as there is a frequent turn-on signal applied to the control terminal G of the semiconductor die 102, the second normally-on pulldown transistor T_PD2 remains off and does not contribute much to the steady state energy loss of the system. The second normally-on pulldown transistor T_PD2 turns on again if the turn off period of the normally-off power transistor T_Power is sustained for a sufficiently long period toff. The off period can be calculated as:

$$t_{\textit{off}} = -R_{OFF1} C_b \ln\left(\frac{V_{th2}}{V_0}\right) \qquad (2)$$

where Vth2 is the turn-off threshold voltage of the second normally-on pulldown transistor T_PD2 and V0 is the initial voltage of the capacitor $C_B$ when the normally-off power transistor T_Power turns off.

Figure 4:
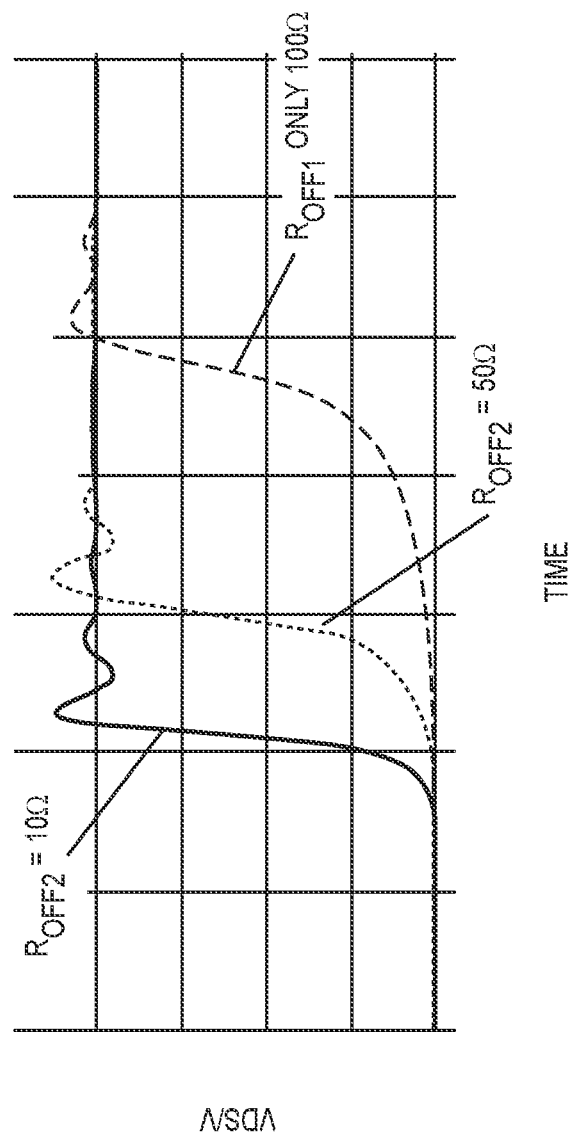
FIG. 4 illustrates turn-off dv/dt slew rate simulation results for different programmable gate path resistances for the semiconductor device of FIG. 2.

As indicated by the dashed waveforms in FIG. 3, the turn-off dv/dt delay for the normally-off power transistor T_Power can be controlled by including $R_{OFF2}$. Notably, the turn-off 'VDS' waveform for the normally-off power transistor T_Power can be controlled by appropriately adjusting $R_{OFF1}$ and $R_{OFF2}$. This aspect is emphasized more in FIG. 4, which shows power switch turn-off dv/dt slew rate simulation results for just $R_{OFF1}$=100Ω (no $R_{OFF2}$), for $R_{OFF1}$=100Ω and $R_{OFF2}$=10Ω, and for $R_{OFF1}$=100Ω and $R_{OFF2}$=50Ω. The capacitor voltage $V_{CB}$ is mostly sustained at about −8V during the entire on/off switching period for the normally-off power transistor T_Power and decays slowly according to the value of $R_H$. An example of $R_H$ can be 1MΩ to 5MΩ.

Since $R_{OFF2}$, if used, is located outside the semiconductor die 102, some parasitic inductance will be in series with $R_{OFF2}$. Simulation results show little to no difference between 0 nH and 4 nH, where 4 nH could be achieved with an external resistor. A poor design with 20 nH in series with $R_{OFF2}$ can affect the turn off behavior, but this effect is inconsequential in comparison to the effect of the value of $R_{OFF2}$.

The pulldown control circuit 204 of the second failsafe pulldown circuit 202 may further include a diode $D_B$ for isolating the first failsafe pulldown circuit 104 and the second failsafe pulldown circuit 202 from one another. In the illustrated example, the diode $D_B$ is in series with the capacitor $C_B$ and electrically connected to the first reference terminal REF1 of the semiconductor die 102 to provide the failsafe pulldown circuit isolation. The diode $D_B$ prevents the paralleled failsafe pulldown circuits 104, 202 from interfering with the operation of each other.

The second failsafe pulldown circuit 202 is optional. Depending on the ohmic class of the normally-off power transistor T_Power, the second failsafe pulldown circuit 202 may be omitted. For example, if the normally-off power transistor T_Power is a high ohmic device, then a high-valued $R_{OFF1}$ may be good enough to clamp the power transistor gate $G_{POWER}$ even if $R_{OFF2}$ is not connected. In this case, second failsafe pulldown circuit 202 may be omitted.

The programmable turn-off failsafe pulldown techniques described herein may be applied to any power switch concept that employs a failsafe pulldown circuit. Described next are a few embodiments of additional power switch systems that incorporate one or both of the failsafe pulldown circuits 104, 202.

Figure 5:
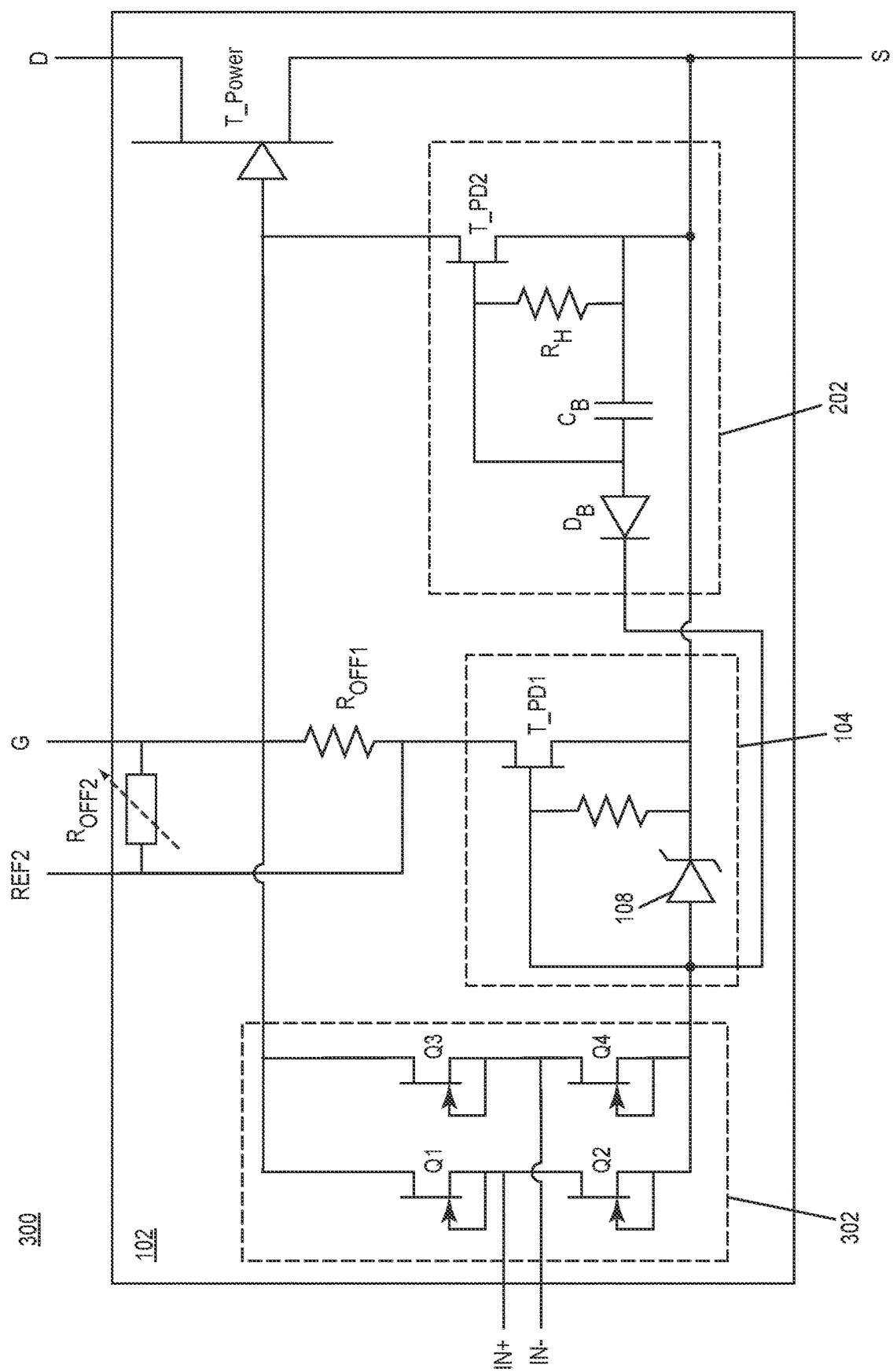
FIG. 5 illustrates an embodiment of both failsafe pulldown circuits implemented in a transformer-based switch device.

FIG. 5 illustrates an embodiment of both failsafe pulldown circuits 104, 202 implemented in a transformer-based switch device 300. The transformer-based switch device 300 illustrated in FIG. 5 is similar to the semiconductor devices 100, 200 illustrated in FIGS. 1 and 2. Different, however, AC energy is provided from a transformer (not shown) to a differential control input IN+/IN− of the transformer-based switch device 300. In FIG. 5, the die terminals labelled 'G' and 'REF2' allow for parallel connection of $R_{OFF1}$ and $R_{OFF2}$ as previously explained herein, if $R_{OFF2}$ is externally connected. A rectifier 302 converts the AC energy at the differential control input IN+/IN− into a DC voltage appropriate for turning on and off the normally-off power transistor T_Power. For example, the rectifier 302 may convert AC energy at the differential control input IN+/IN− into a DC gate-to-source voltage $V_{GS}$ greater than a threshold voltage of the normally-off power transistor T_Power plus the clamp voltage of the clamp diode which is greater than threshold voltage of the normally on device T_PD1, e.g., 3.3V+7V, so as to turn on the normally-off power transistor T_Power. In the illustrated example, the rectifier 302 is implemented as two half bridges each formed by a first gated diode Q1/Q3 in series with a second gated diode Q2/Q4. Other types of rectification devices may be used such as diodes, synchronous rectification (sync-rect) devices, etc.

Figure 6:
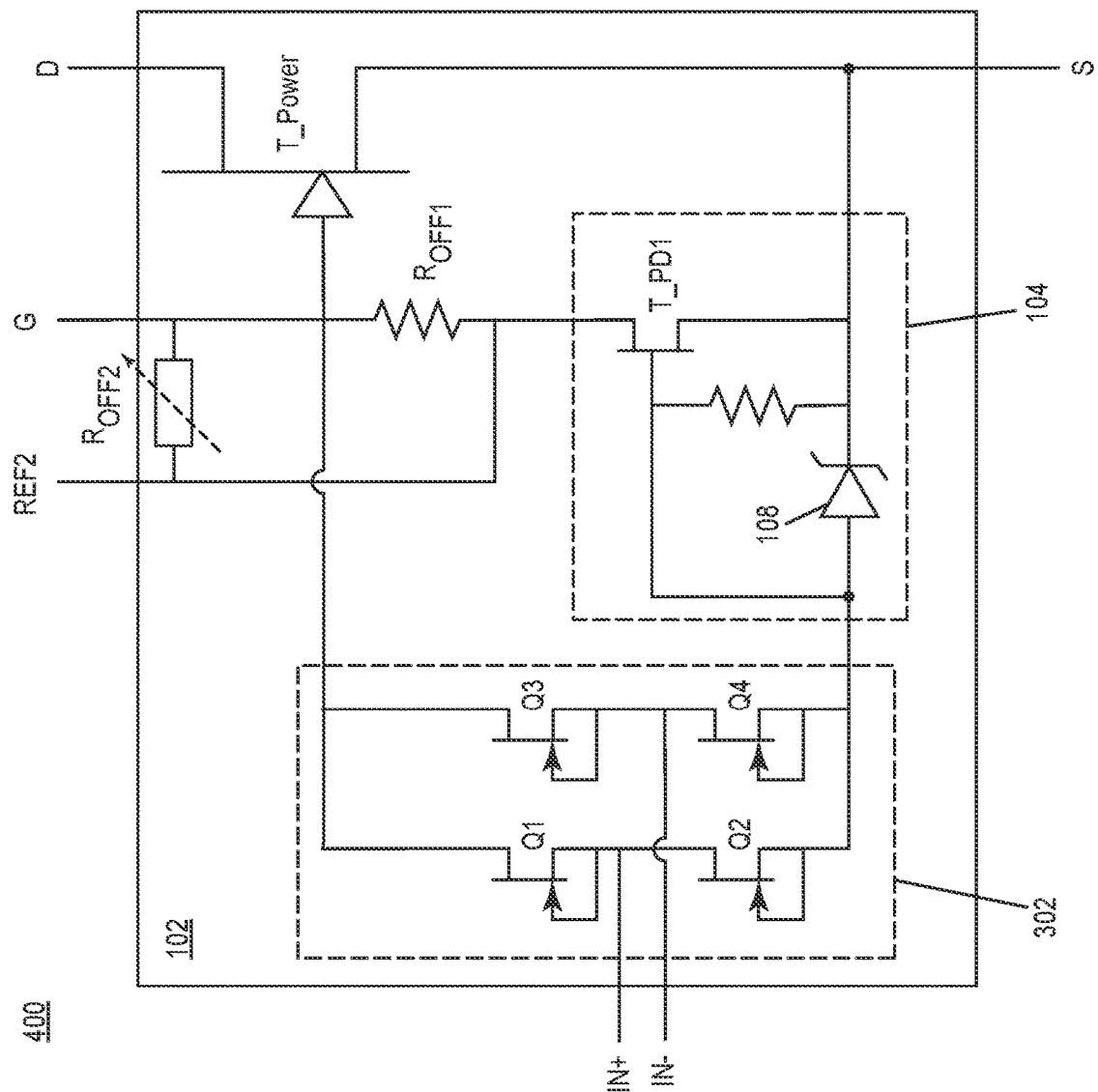
FIG. 6 illustrates an embodiment of a transformer-based switch device that includes the first failsafe pulldown circuit but not the second failsafe pulldown circuit.

FIG. 6 illustrates another embodiment of a transformer-based switch device 400. The embodiment shown in FIG. 6 is similar to the embodiment shown in FIG. 5. Different, however, the transformer-based switch device 400 in FIG. 6 includes the first failsafe pulldown circuit 104 but not the second failsafe pulldown circuit 202. The transformer-based switch device 300 in FIG. 5 may be implemented in a low ohmic GaN application whereas the transformer-based switch device 400 in FIG. 6 may be implemented in a high ohmic GaN application where the additional gate clamping/pulldown functionality provided by the second failsafe pulldown circuit 202 is not needed.

Figure 7:
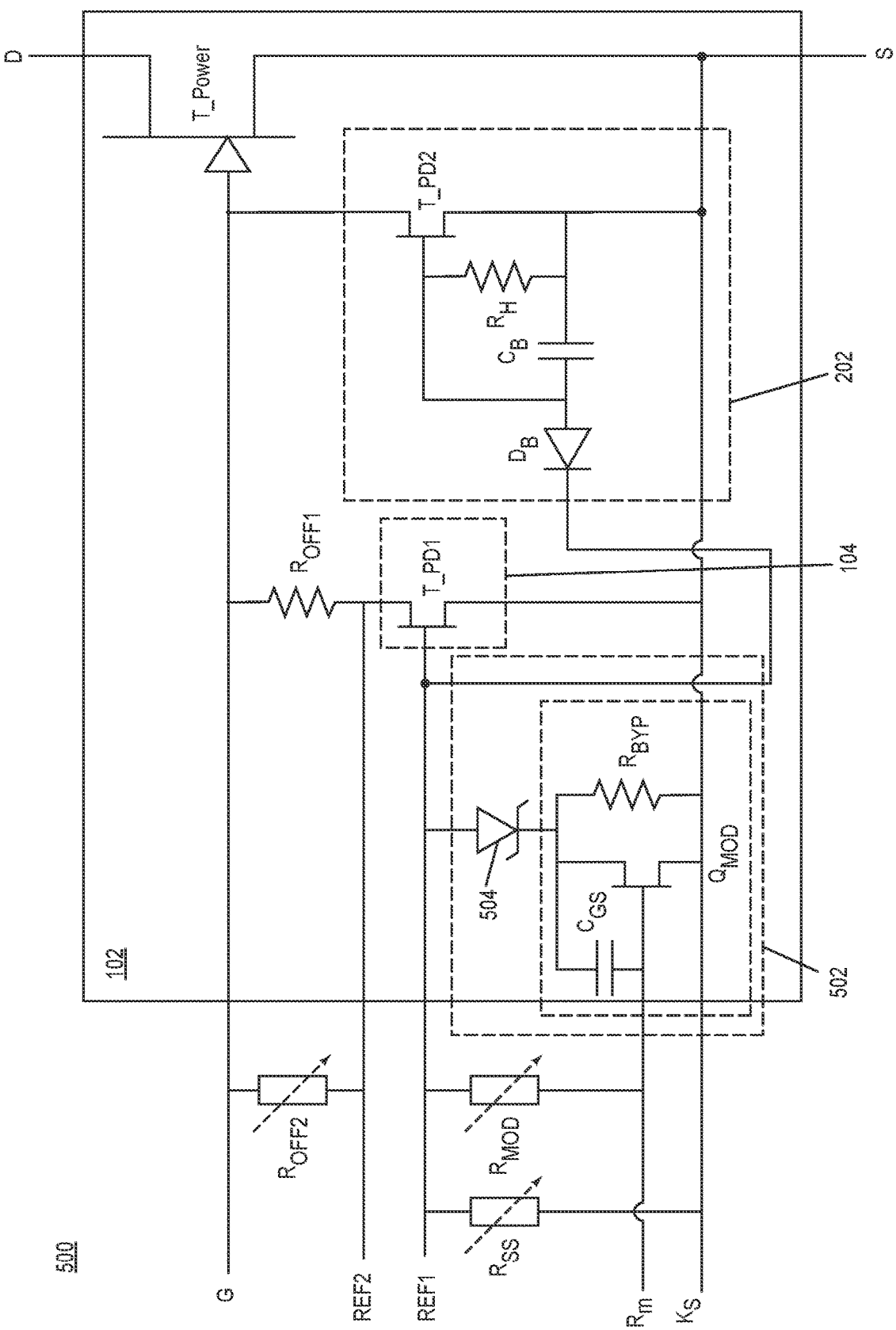
FIG. 7 illustrates an embodiment of a semiconductor device that includes both failsafe pulldown circuits and a resistance modulation circuit for controlling turn-on time.

FIG. 7 illustrates another embodiment of a semiconductor device 500 that includes both failsafe pulldown circuits 104, 202. In the example illustrated the semiconductor device 500 also includes both failsafe pulldown circuits 104, 202 and a resistance modulation circuit 502. The resistance modulation circuit 502 implements on-time control for the normally-off power transistor T_Power, and includes a voltage clamp 504 that autonomously provides the desired control of the first normally-on pulldown transistor T_PD1 of the first failsafe pulldown circuit 104. The voltage clamp 504 is configured to generate a pulldown gate-to-source voltage $V_{PD\_GS}$ that is below the negative threshold voltage $V_{PD\_THR}$ that is required to turn off the first normally-on pulldown transistor T_PD1, during intervals when the normally-off power transistor T_Power is on (conducting). The voltage clamp 504 may be, or be modelled as, a diode having a threshold voltage. The magnitude of the forward threshold voltage for a typical diode is lower than the magnitude of the turn-off threshold voltage $V_{PD\_THR}$ of the first normally-on pulldown transistor T_PD1. While illustrated as a single diode, the voltage clamp 504 may actually include several individual diodes cascaded (stacked) in series, so as to achieve a clamping voltage $V_{CL}$ that is needed to turn-off the first normally-on pulldown transistor T_PD1, i.e., $V_{CL}>|V_{PD\_THR}|$.

The resistance modulation circuit 502 also includes a modulation switch $Q_{MOD}$, which alters the resistance of a gate path loop of the normally-off power transistor T_Power when the normally-off power transistor T_Power is turned on and first normally-on pulldown transistor T_PD1 is turned off. This gate path loop is the current loop from the control terminal G of the semiconductor die 102 to the first reference terminal REF1, and includes, when the normally-off power transistor T_Power is on, the gate of the normally-off power transistor T_Power, the source of the normally-off power transistor T_Power, and a path, through the first failsafe pulldown circuit 104, that returns to the first reference terminal REF1. When the modulation switch $Q_{MOD}$ is turned on, a low-impedance path is formed through the modulation switch $Q_{MOD}$ and the voltage clamp 504, each of which provide negligible resistance. When the modulation switch $Q_{MOD}$ is turned off, the current is instead forced to flow through the resistor $R_{BYP}$, which presents a high-impedance path, at least as compared with the current path through modulation switch $Q_{MOD}$. The low-impedance path instantiated when the modulation switch $Q_{MOD}$ is turned on provides a high-current transition pulse. The high-impedance path instantiated when the modulation switch $Q_{MOD}$ is turned off provides a low level of current for maintaining the on state of the normally-off power transistor T_Power.

The illustrated modulation switch $Q_{MOD}$ is a normally-on (depletion mode) HEMT, and is preferably integrated in the same GaN die 102 as the normally-off power transistor T_Power. The modulation switch $Q_{MOD}$ has an associated gate-to-source capacitance $C_{GS}$, which may not be a separate component but can be an intrinsic capacitance of the modulation switch $Q_{MOD}$. This capacitance $C_{GS}$ is expressly shown in FIG. 7, as it affects the duration of the high-current pulse. A modulation resistor $R_{MOD}$ couples the first reference terminal REF1 and the gate of first normally-on pulldown transistor T_PD1 to the gate of the modulation switch $Q_{MOD}$, and the resistance of the modulation resistor $R_{MOD}$ is chosen to achieve a desired duration of the high-current pulse. An additional resistor $R_{SS}$ may be coupled between the first reference terminal REF1 and the source node/potential of the semiconductor device 500. The modulation resistor $R_{MOD}$ and/or the additional resistor $R_{SS}$ may be external resistors. In this case, the semiconductor die 102 may include additional terminals Rm, Ks for connecting the resistors $R_{MOD}$, $R_{SS}$ where terminal Ks may be an effective Kelvin-source terminal or another type of dedicated small signal terminal electrically connected to the source $S_{POWER}$ of the normally-off power transistor T_Power.

Figure 8:
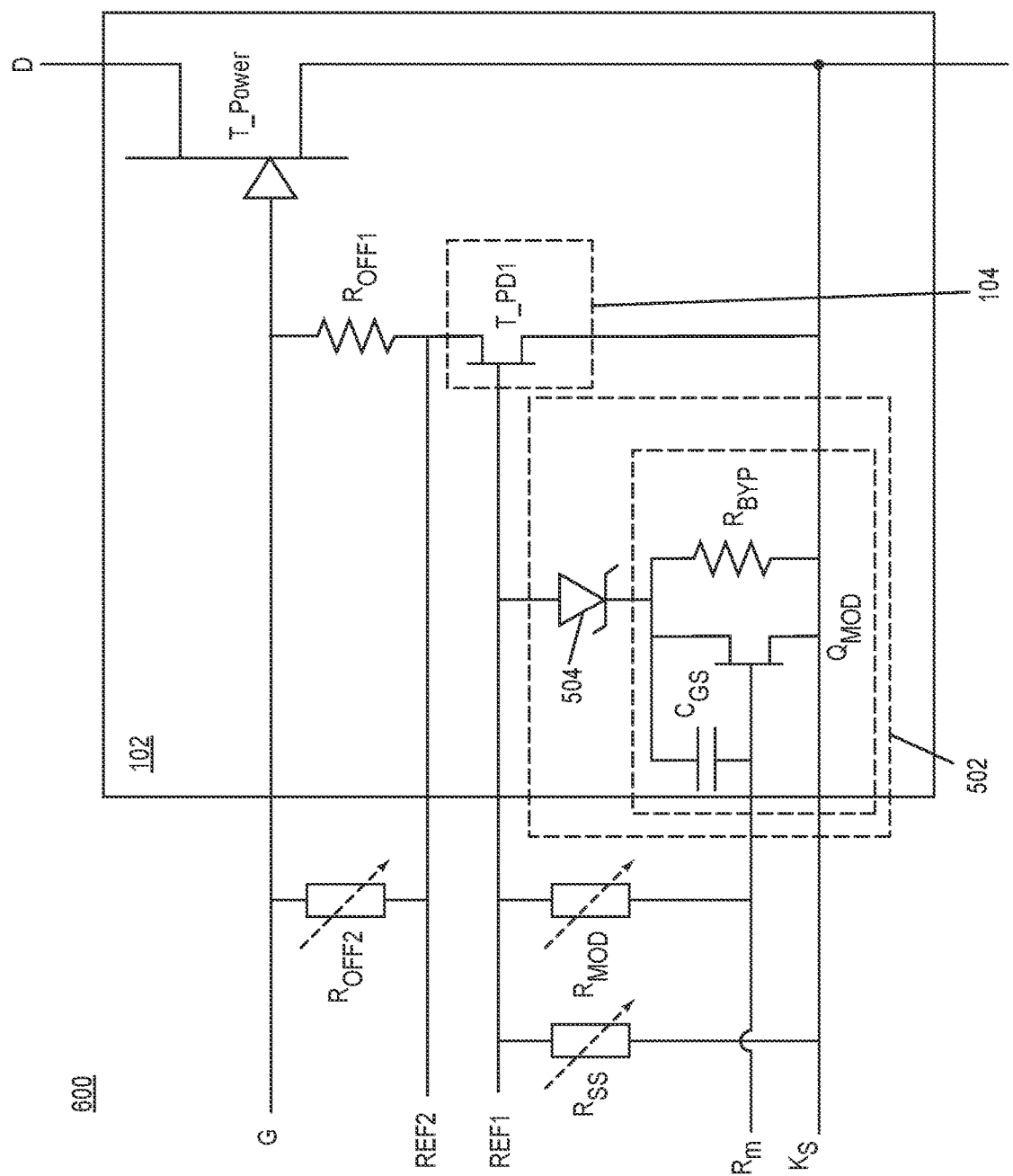
FIG. 8 illustrates an embodiment of a semiconductor device that includes the resistance modulation circuit and the first failsafe pulldown circuit but not the second failsafe pulldown circuit.

FIG. 8 illustrates another embodiment of a semiconductor device 600 that includes the resistance modulation circuit 502. The embodiment shown in FIG. 8 is similar to the embodiment shown in FIG. 7. Different, however, the semiconductor device 600 in FIG. 6 includes the first failsafe pulldown circuit 104 but not the second failsafe pulldown circuit 202. The semiconductor device 500 in FIG. 7 may be implemented in a low ohmic GaN application whereas the semiconductor device 600 in FIG. 8 may be implemented in a high ohmic GaN application where the additional gate clamping/pulldown functionality provided by the second failsafe pulldown circuit 202 is not needed.

Although the present disclosure is not so limited, the following numbered examples demonstrate one or more aspects of the disclosure.

Example 1. A semiconductor device, comprising: a normally-off power transistor integrated in a semiconductor die, wherein a gate of the normally-off power transistor is electrically connected to a control terminal of the semiconductor die; and a first failsafe pulldown circuit comprising: a first normally-on pulldown transistor integrated in the semiconductor die, wherein a gate of the first normally-on pulldown transistor is electrically connected to a first reference terminal of the semiconductor die, wherein the first normally-on pulldown transistor is configured to pull down the gate of the normally-off power transistor to a voltage below a threshold voltage of the normally-off power transistor when no voltage is applied across the control terminal and the first reference terminal; and a turn-off time control circuit configured to control a turn-off time of the normally-off power transistor.

Example 2. The semiconductor device of example 1, wherein the turn-off time control circuit comprises a first resistor integrated in the semiconductor die and electrically connected in series between the first normally-on pulldown transistor and the gate of the normally-off power transistor.

Example 3. The semiconductor device of example 2, wherein the turn-off time control circuit further comprises a second resistor external to the semiconductor die and electrically connected in parallel with the first resistor.

Example 4. The semiconductor device of example 3, wherein the first resistor has a higher resistance than the second resistor.

Example 5. The semiconductor device of example 3 or 4, wherein the second resistor has a fixed resistance.

Example 6. The semiconductor device of example 3 or 4, wherein the second resistor has a programmable resistance.

Example 7. The semiconductor device of any of examples 3, 4 and 6, wherein the second resistor is a programmable resistor included in a controller configured to control switching of the normally-off power transistor.

Example 8. The semiconductor device of any of examples 3 through 7, wherein the semiconductor die includes a second reference terminal electrically connected to a node between the first resistor and the first normally-on pulldown transistor, and wherein both the first resistor and the second resistor are electrically connected between the control terminal and the second reference terminal.

Example 9. The semiconductor device of any of examples 1 through 8, wherein the first failsafe pulldown circuit further comprises a pulldown control circuit connected between the gate of the first normally-on pulldown transistor and a source of the first normally-on pulldown transistor, and wherein the pulldown control circuit is configured to autonomously apply a negative voltage to the gate of the first normally-on pulldown transistor, relative to the source of the first normally-on pulldown transistor, when a turn-on voltage is applied between the control terminal and the first reference terminal, and to autonomously discharge the negative voltage when the turn-on voltage is not applied between the control terminal and the first reference terminal.

Example 10. The semiconductor device of any of examples 1 through 9, further comprising: a second failsafe pulldown circuit configured to pull down the gate of the normally-off power transistor to a voltage below the threshold voltage of the normally-off power transistor when the normally-off power transistor is in a powered down state during which no switching of the normally-off power transistor occurs.

Example 11. The semiconductor device of example 10, wherein the second failsafe pulldown circuit comprises: a second normally-on pulldown transistor integrated in the semiconductor die, wherein a gate of the second normally-on pulldown transistor is electrically connected to the first reference terminal, e.g., through a diode; and a pulldown control circuit connected between a gate of the second normally-on pulldown transistor and a source of the second normally-on pulldown transistor, wherein the pulldown control circuit is configured to hold the gate of the second normally-on pulldown transistor above a turn-off voltage of the second normally-on pulldown transistor when the normally-off power transistor is in the powered down state.

Example 12. The semiconductor device of example 11, wherein the pulldown control circuit is configured to lower the voltage at the gate of the second normally-on pulldown transistor to below the turn-off voltage of the second normally-on pulldown transistor when the normally-off power transistor is in a normal switching state during which the normally-off power transistor is successively switched on and off responsive to a switching control signal input to the control terminal.

Example 13. The semiconductor device of example 11 or 12, wherein the pulldown control circuit comprises: a capacitor electrically connected between the gate of the second normally-on pulldown transistor and the source of the second normally-on pulldown transistor; and a third resistor electrically connected between the gate of the second normally-on pulldown transistor and the source of the second normally-on pulldown transistor.

Example 14. The semiconductor device of example 13, wherein an RC time constant of the capacitor and resistor determines when the second normally-on pulldown transistor turns on again after having previously turned off.

Example 15. The semiconductor device of example 13 or 14, wherein the capacitor is recharged each time the normally-off power transistor is switched on, and wherein a voltage of the capacitor continuously holds the gate of the second normally-on pulldown transistor below the turn-off voltage of the second normally-on pulldown transistor when the normally-off power transistor is in a normal switching state during which the normally-off power transistor is successively switched on and off responsive to a switching control signal input to the control terminal.

Example 16. The semiconductor device of example 15, wherein the capacitor voltage rises above the turn-off voltage of the second normally-on pulldown transistor when the normally-off power transistor remains switched off for 1 ms or more.

Example 17. The semiconductor device of any of examples 13 through 16, wherein the pulldown control circuit further comprises: a diode in series with the capacitor and electrically connected to the first reference terminal such that the diode isolates the first failsafe pulldown circuit and the second failsafe pulldown circuit from one another.

Example 18. The semiconductor device of any of examples 1 through 17, wherein the semiconductor die is a GaN die, wherein the normally-off power transistor is a normally-off GaN HEMT (high-electron mobility transistor), and wherein the first normally-on pulldown transistor is a normally-on GaN HEMT.

Example 19. The semiconductor device of any of examples 1 through 18, wherein the semiconductor die includes a second reference terminal electrically connected to a node between the first resistor and the first normally-on pulldown transistor.

Example 20. A semiconductor die, comprising: a control terminal; a first reference terminal; a normally-off power transistor having a gate electrically connected to the control terminal; and a first failsafe pulldown circuit comprising: a first normally-on pulldown transistor having a gate electrically connected to the first reference terminal, wherein the first normally-on pulldown transistor is configured to pull down the gate of the normally-off power transistor to a voltage below a threshold voltage of the normally-off power transistor when no voltage is applied across the control terminal and the first reference terminal; and a first resistor electrically connected in series between the first normally-on pulldown transistor and the gate of the normally-off power transistor.

Example 21. The semiconductor die of example 20, further comprising: a second failsafe pulldown circuit configured to pull down the gate of the normally-off power transistor to a voltage below the threshold voltage of the normally-off power transistor when the normally-off power transistor is in a powered down state during which no switching of the normally-off power transistor occurs.

Example 22. The semiconductor die of example 20 or 21, further comprising: a second reference terminal electrically connected to a node between the first resistor and a drain of the first normally-on pulldown transistor.

As used herein, the terms "having," "containing," "including," "comprising," and the like are open-ended terms that indicate the presence of stated elements or features, but do not preclude additional elements or features. The articles "a," "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:
1. A semiconductor device, comprising:
a normally-off power transistor integrated in a semiconductor die, wherein a gate of the normally-off power transistor is electrically connected to a control terminal of the semiconductor die; and
a first failsafe pulldown circuit comprising:
a first normally-on pulldown transistor integrated in the semiconductor die, wherein a gate of the first normally-on pulldown transistor is electrically connected to a first reference terminal of the semiconductor die, wherein the first normally-on pulldown transistor is configured to pull down the gate of the normally-off power transistor to a voltage below a threshold voltage of the normally-off power transistor when no voltage is applied across the control terminal and the first reference terminal; and
a turn-off time control circuit configured to control a turn-off time of the normally-off power transistor,
wherein the turn-off time control circuit comprises a first resistor integrated in the semiconductor die and elec- trically connected in series between the first normally-on pulldown transistor and the gate of the normally-off power transistor.

2. The semiconductor device of claim 1, wherein the turn-off time control circuit further comprises a second resistor external to the semiconductor die and electrically connected in parallel with the first resistor.

3. The semiconductor device of claim 2, wherein the first resistor has a higher resistance than the second resistor.

4. The semiconductor device of claim 2, wherein the second resistor has a fixed resistance.

5. The semiconductor device of claim 2, wherein the second resistor has a programmable resistance.

6. The semiconductor device of claim 2, wherein the second resistor is a programmable resistor included in a controller configured to control switching of the normally-off power transistor.

7. The semiconductor device of claim 2, wherein the semiconductor die includes a second reference terminal electrically connected to a node between the first resistor and the first normally-on pulldown transistor, and wherein both the first resistor and the second resistor are electrically connected between the control terminal and the second reference terminal.

8. The semiconductor device of claim 1, wherein the first failsafe pulldown circuit further comprises a pulldown control circuit connected between the gate of the first normally-on pulldown transistor and a source of the first normally-on pulldown transistor, and wherein the pulldown control circuit is configured to autonomously apply a negative voltage to the gate of the first normally-on pulldown transistor, relative to the source of the first normally-on pulldown transistor, when a turn-on voltage is applied between the control terminal and the first reference terminal, and to autonomously discharge the negative voltage when the turn-on voltage is not applied between the control terminal and the first reference terminal.

9. The semiconductor device of claim 1, further comprising:
a second failsafe pulldown circuit configured to pull down the gate of the normally-off power transistor to a voltage below the threshold voltage of the normally-off power transistor when the normally-off power transistor is in a powered down state during which no switching of the normally-off power transistor occurs.

10. The semiconductor device of claim 9, wherein the second failsafe pulldown circuit comprises:
a second normally-on pulldown transistor integrated in the semiconductor die, wherein a gate of the second normally-on pulldown transistor is electrically connected to the first reference terminal; and
a pulldown control circuit connected between a gate of the second normally-on pulldown transistor and a source of the second normally-on pulldown transistor,
wherein the pulldown control circuit is configured to hold the gate of the second normally-on pulldown transistor above a turn-off voltage of the second normally-on pulldown transistor when the normally-off power transistor is in the powered down state.

11. The semiconductor device of claim 10, wherein the pulldown control circuit is configured to lower the voltage at the gate of the second normally-on pulldown transistor to below the turn-off voltage of the second normally-on pulldown transistor when the normally-off power transistor is in a normal switching state during which the normally-off power transistor is successively switched on and off responsive to a switching control signal input to the control terminal.

12. The semiconductor device of claim 10, wherein the pulldown control circuit comprises:
a capacitor electrically connected between the gate of the second normally-on pulldown transistor and the source of the second normally-on pulldown transistor; and
a third resistor electrically connected between the gate of the second normally-on pulldown transistor and the source of the second normally-on pulldown transistor.

13. The semiconductor device of claim 12, wherein an RC time constant of the capacitor and resistor determines when the second normally-on pulldown transistor turns on again after having previously turned off.

14. The semiconductor device of claim 12, wherein the capacitor is recharged each time the normally-off power transistor is switched on, and wherein a voltage of the capacitor continuously holds the gate of the second normally-on pulldown transistor below the turn-off voltage of the second normally-on pulldown transistor when the normally-off power transistor is in a normal switching state during which the normally-off power transistor is successively switched on and off responsive to a switching control signal input to the control terminal.

15. The semiconductor device of claim 14, wherein the capacitor voltage rises above the turn-off voltage of the second normally-on pulldown transistor when the normally-off power transistor remains switched off for 1 ms or more.

16. The semiconductor device of claim 12, wherein the pulldown control circuit further comprises:
a diode in series with the capacitor and electrically connected to the first reference terminal such that the diode isolates the first failsafe pulldown circuit and the second failsafe pulldown circuit from one another.

17. The semiconductor device of claim 1, wherein the semiconductor die is a GaN die, wherein the normally-off power transistor is a normally-off GaN HEMT (high-electron mobility transistor), and wherein the first normally-on pulldown transistor is a normally-on GaN HEMT.

18. The semiconductor device of claim 1, wherein the semiconductor die includes a second reference terminal electrically connected to a node between the first resistor and the first normally-on pulldown transistor.

19. A semiconductor die, comprising:
a control terminal;
a first reference terminal;
a normally-off power transistor having a gate electrically connected to the control terminal; and
a first failsafe pulldown circuit comprising:
a first normally-on pulldown transistor having a gate electrically connected to the first reference terminal, wherein the first normally-on pulldown transistor is configured to pull down the gate of the normally-off power transistor to a voltage below a threshold voltage of the normally-off power transistor when no voltage is applied across the control terminal and the first reference terminal; and
a first resistor electrically connected in series between the first normally-on pulldown transistor and the gate of the normally-off power transistor.

20. The semiconductor die of claim 19, further comprising:
a second failsafe pulldown circuit configured to pull down the gate of the normally-off power transistor to a voltage below the threshold voltage of the normally-off power transistor when the normally-off power transistor is in a powered down state during which no switching of the normally-off power transistor occurs.

21. The semiconductor die of claim 19, further comprising:
a second reference terminal electrically connected to a node between the first resistor and a drain of the first normally-on pulldown transistor.

22. A semiconductor device, comprising:
a normally-off power transistor integrated in a semiconductor die, wherein a gate of the normally-off power transistor is electrically connected to a control terminal of the semiconductor die; and
a first failsafe pulldown circuit comprising:
  a first normally-on pulldown transistor integrated in the semiconductor die, wherein a gate of the first normally-on pulldown transistor is electrically connected to a first reference terminal of the semiconductor die, wherein the first normally-on pulldown transistor is configured to pull down the gate of the normally-off power transistor to a voltage below a threshold voltage of the normally-off power transistor when no voltage is applied across the control terminal and the first reference terminal; and
  a turn-off time control circuit configured to control a turn-off time of the normally-off power transistor,
wherein the first failsafe pulldown circuit further comprises a pulldown control circuit connected between the gate of the first normally-on pulldown transistor and a source of the first normally-on pulldown transistor,
wherein the pulldown control circuit is configured to autonomously apply a negative voltage to the gate of the first normally-on pulldown transistor, relative to the source of the first normally-on pulldown transistor, when a turn-on voltage is applied between the control terminal and the first reference terminal, and to autonomously discharge the negative voltage when the turn-on voltage is not applied between the control terminal and the first reference terminal.

23. A semiconductor device, comprising:
a normally-off power transistor integrated in a semiconductor die, wherein a gate of the normally-off power transistor is electrically connected to a control terminal of the semiconductor die;
a first failsafe pulldown circuit comprising:
  a first normally-on pulldown transistor integrated in the semiconductor die, wherein a gate of the first normally-on pulldown transistor is electrically connected to a first reference terminal of the semiconductor die, wherein the first normally-on pulldown transistor is configured to pull down the gate of the normally-off power transistor to a voltage below a threshold voltage of the normally-off power transistor when no voltage is applied across the control terminal and the first reference terminal; and
  a turn-off time control circuit configured to control a turn-off time of the normally-off power transistor; and
a second failsafe pulldown circuit configured to pull down the gate of the normally-off power transistor to a voltage below the threshold voltage of the normally-off power transistor when the normally-off power transistor is in a powered down state during which no switching of the normally-off power transistor occurs.

24. The semiconductor device of claim 23, wherein the second failsafe pulldown circuit comprises:
a second normally-on pulldown transistor integrated in the semiconductor die, wherein a gate of the second normally-on pulldown transistor is electrically connected to the first reference terminal; and
a pulldown control circuit connected between a gate of the second normally-on pulldown transistor and a source of the second normally-on pulldown transistor,
wherein the pulldown control circuit is configured to hold the gate of the second normally-on pulldown transistor above a turn-off voltage of the second normally-on pulldown transistor when the normally-off power transistor is in the powered down state.

25. The semiconductor device of claim 24, wherein the pulldown control circuit is configured to lower the voltage at the gate of the second normally-on pulldown transistor to below the turn-off voltage of the second normally-on pulldown transistor when the normally-off power transistor is in a normal switching state during which the normally-off power transistor is successively switched on and off responsive to a switching control signal input to the control terminal.

26. The semiconductor device of claim 24, wherein the pulldown control circuit comprises:
a capacitor electrically connected between the gate of the second normally-on pulldown transistor and the source of the second normally-on pulldown transistor; and
a resistor electrically connected between the gate of the second normally-on pulldown transistor and the source of the second normally-on pulldown transistor.

27. The semiconductor device of claim 26, wherein an RC time constant of the capacitor and resistor determines when the second normally-on pulldown transistor turns on again after having previously turned off.

28. The semiconductor device of claim 26, wherein the capacitor is recharged each time the normally-off power transistor is switched on, and wherein a voltage of the capacitor continuously holds the gate of the second normally-on pulldown transistor below the turn-off voltage of the second normally-on pulldown transistor when the normally-off power transistor is in a normal switching state during which the normally-off power transistor is successively switched on and off responsive to a switching control signal input to the control terminal.

29. The semiconductor device of claim 28, wherein the capacitor voltage rises above the turn-off voltage of the second normally-on pulldown transistor when the normally-off power transistor remains switched off for 1 ms or more.

30. The semiconductor device of claim 26, wherein the pulldown control circuit further comprises:
a diode in series with the capacitor and electrically connected to the first reference terminal such that the diode isolates the first failsafe pulldown circuit and the second failsafe pulldown circuit from one another.

* * * * *